(12) United States Patent
Watanabe et al.

(10) Patent No.: US 8,420,299 B2
(45) Date of Patent: Apr. 16, 2013

(54) FORMING METHOD OF RESIST PATTERN AND MANUFACTURING METHOD OF THIN-FILM MAGNETIC HEAD

(75) Inventors: Hisayoshi Watanabe, Tokyo (JP); Susumu Aoki, Tokyo (JP)

(73) Assignee: TDK Corporation, Tokyo (JP)

( * ) Notice: Subject to any disclaimer, the term of this patent is extended or adjusted under 35 U.S.C. 154(b) by 1230 days.

(21) Appl. No.: 12/187,128

(22) Filed: Aug. 6, 2008

(65) Prior Publication Data

US 2010/0035189 A1   Feb. 11, 2010

(51) Int. Cl.
*G03F 7/039* (2006.01)
*G03F 7/20* (2006.01)
*G03F 7/30* (2006.01)
*G03F 7/38* (2006.01)

(52) U.S. Cl.
USPC ........... 430/311; 430/313; 430/315; 430/319; 430/320; 430/324; 430/326; 430/329; 430/330; 430/921; 430/925

(58) Field of Classification Search .................. None
See application file for complete search history.

(56) References Cited

U.S. PATENT DOCUMENTS 5,547,788 A * 8/1996 Han et al. ........................ 430/5
2005/0282082 A1 * 12/2005 Tachibana et al. ......... 430/270.1

FOREIGN PATENT DOCUMENTS

| JP | 61-107514 | * | 5/1986 |
| JP | 06-051515 |   | 2/1994 |
| JP | 07-106234 |   | 4/1995 |

OTHER PUBLICATIONS

JPO English abstract for JP 61-107514 (1986).*
Machine-assisted English translation of JP 6-51515 (Namiki et al) (1994).*
Full English translation of JP61-107514 (Koshikawa) provided by PTO (1986).*

* cited by examiner

*Primary Examiner* — Sin J. Lee
(74) *Attorney, Agent, or Firm* — Frommer Lawrence & Haug LLP

(57) ABSTRACT

It is therefore an object of the present invention to provide a forming method for a resist pattern to reduce a resist residue in forming the resist pattern on a step whose gradient angle is equal to 90 degrees or more.
A forming method for a resist pattern to reduce a resist residue on a step is provided, the method comprising: forming resist film with coating resist containing photo-acid-generator on a step formed on a substrate, where gradient angle of the step is equal to 90 degrees or more, exposing said resist film and generating acid from said photo-acid-generator.

12 Claims, 7 Drawing Sheets

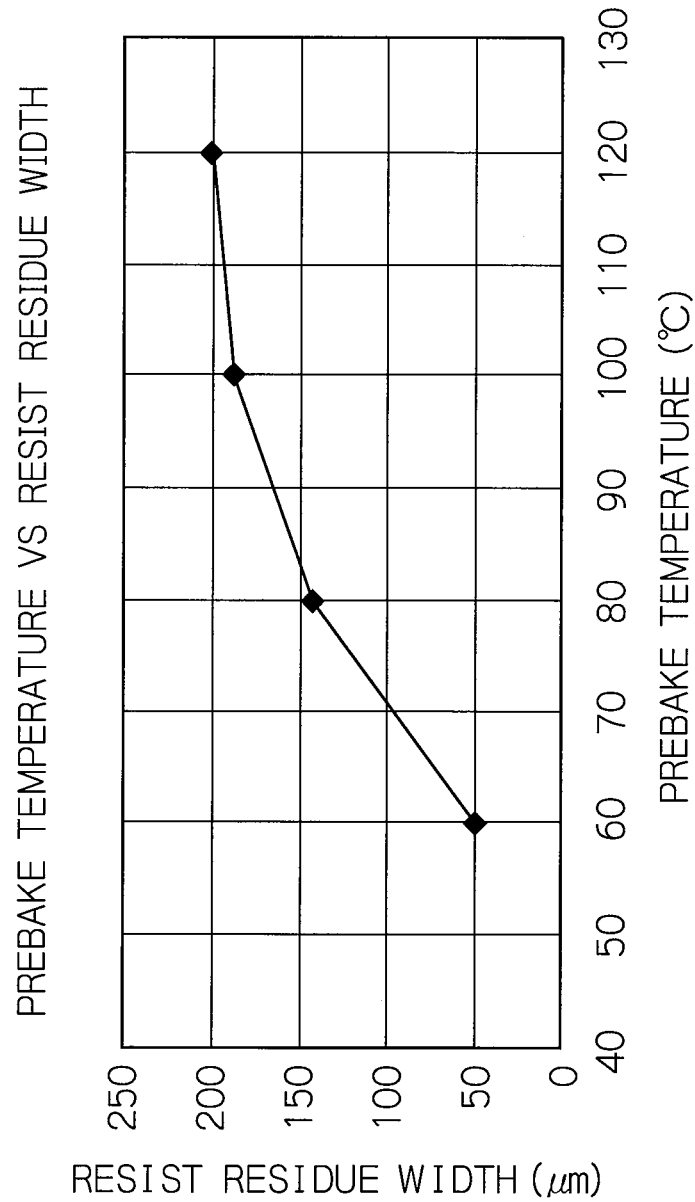

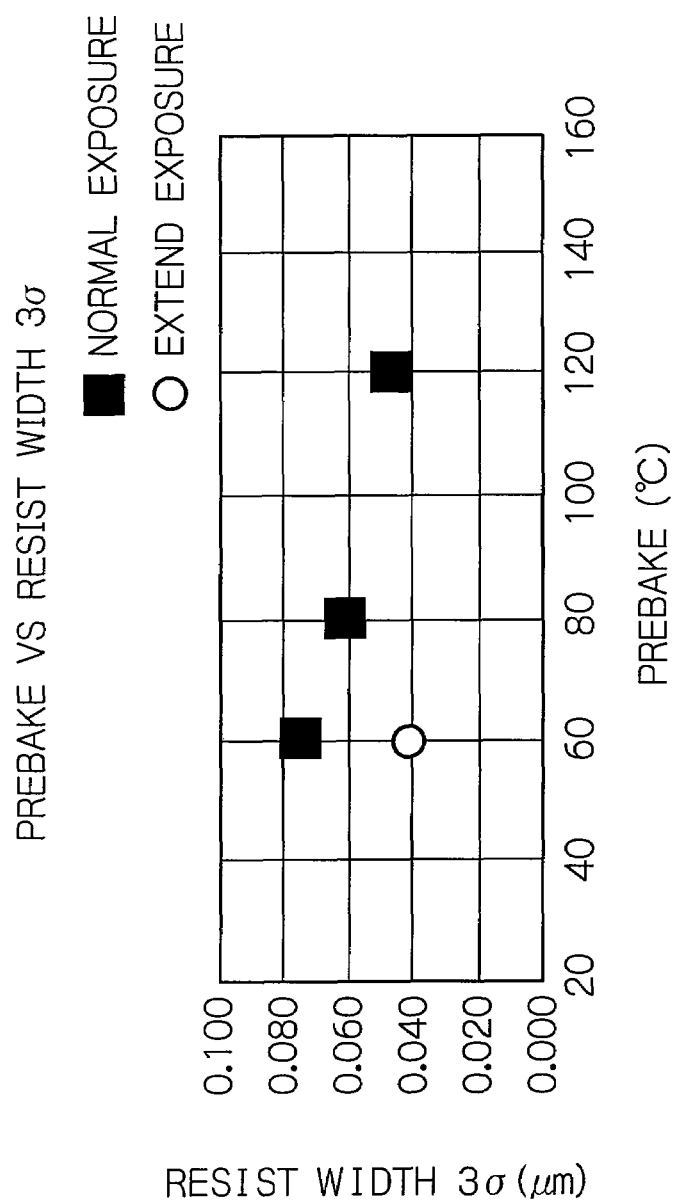

Fig. 8a1 TRACK WIDTH DIRECTION  Fig. 8a2
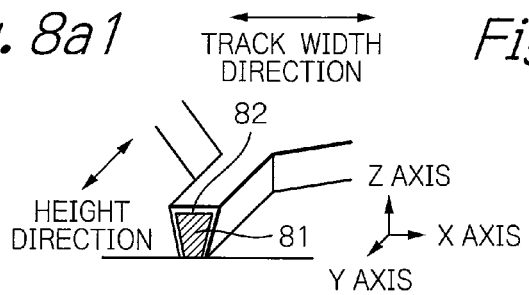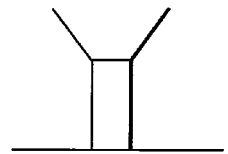
Fig. 8b1  Fig. 8b2
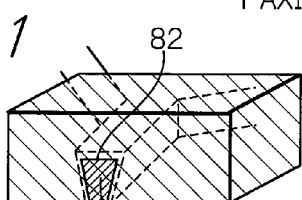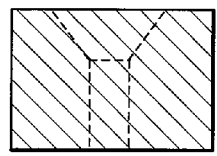
Fig. 8c1  Fig. 8c2
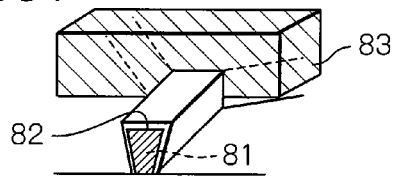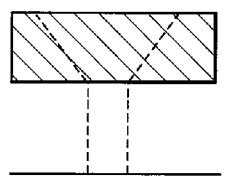
Fig. 8d
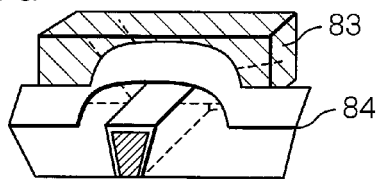
Fig. 8e
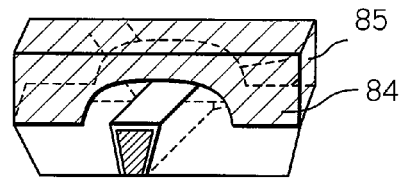
Fig. 8f1  Fig. 8f2
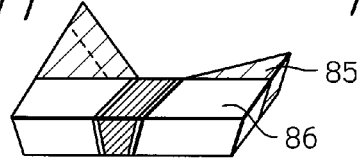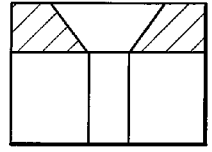

FORMING METHOD OF RESIST PATTERN AND MANUFACTURING METHOD OF THIN-FILM MAGNETIC HEAD

BACKGROUND OF THE INVENTION

1. Field of the Invention

The present invention relates to a forming method of a resist pattern with a chemically-amplified resist and a manufacturing method of a thin-film magnetic head with the resist pattern formed with this method.

2. Description of the Related Art

In case of manufacturing thin-film elements such as thin-film magnetic heads, semiconductor elements, or micro devices, a process of forming a photo resist pattern is frequently performed.

In this case, the photo resist pattern could be formed on steps formed on a substrate. Especially, in an integrated process, for example, a perpendicular magnetic head, there is a case of forming the resist pattern so as to cover a magnetic pole having the steps whose gradient angle is equal to 90 degrees or more. In case of forming a positive type photo resist pattern, the steps make shade portions, therefore sufficient exposure is not performed in the shade portions. In forming the positive type photo resist pattern, the resist pattern is formed by eliminating the exposed portion with development so that the unexposed portion is residual without being eliminated with the development. If the portion which should be exposed is not exposed, a resist residue could occur at this portion. The resist residue causes a problem since this portion does not apply plating well in a latter process.

For example, we consider forming the resist pattern on the step formed on the substrate as FIG. 1a. In the step, gradient angle θ is 90 degrees or more. Here, the angle θ is a supplementary angle of an angle ϕ between a wall surface 10 and a surface 11 of a layer containing the step. The resist pattern is formed by coating the resist on the step, exposing the resist via a reticle, etc., and then developing the resist. In the case of forming the resist pattern 12 as in FIG. 1b, a ledge of the resist occur (a resist residue 13) at the portion among the wall surface 10, the surface 11 of the layer containing the step, and the resist pattern 12. In FIG. 1b, a darker-shaded area is the resist residue 13. Since the gradient angle θ is equal to 90 degrees or more, exposing light is shielded by the step. For this reason, an unexposed portion is made. In the case of a plating resist pattern formed above, the tracing of the portion of resist residue 13 causes a problem that a desired plating is not formed.

BRIEF SUMMARY OF THE INVENTION

It is therefore an object of the present invention to provide a forming method for a resist pattern to reduce a resist residue in forming the resist pattern on a step whose gradient angle is equal to 90 degrees or more. Further, it is another object of the present invention to provide a manufacturing method of a thin-film magnetic head with the resist pattern formed with this method.

According to the present invention, a forming method for a resist pattern to reduce a resist residue on a step is provided, the method comprising steps of: forming a resist film with a coating resist containing photo-acid-generator on a step formed on a substrate, where gradient angle of the step is equal to 90 degrees or more, exposing said resist film and generating acid from said photo-acid-generator.

It is preferable that a concentration of said photo-acid-generator is less than 1% by weight.

It is preferable that said photo-acid-generator is either Triphenylsulfoniumhexafluoroantimonate photo-acid-generator, Triphenylsulfonium type photo-acid-generator, or Bisiodonium type photo-acid-generator.

It is preferable that baking of said resist film is preformed from 60° C. to 70° C. after forming said resist film and before said exposure. Further, it is more preferable that baking of said resist film is preformed at 60° C. after forming said resist film and before said exposure.

When temperature of the pre-bake is lower, residual solvent in the resist remains. Since diffusion of the photo-acid-generator becomes large, this makes the photo-acid-generator reach an unexposed portion or hardly exposed portion. As a result, pre-baking at 70° C. makes a width of the resist residue decrease less than a half width at 120° C. Further, the pre-bake at 60° C. makes a width of the resist residue decrease less than a quarter width at 120° C.

It is preferable that said exposure of the resist film is an extended exposure.

When temperature of the pre-bake is lower, the diffusion of the photo-acid-generator becomes large, and then resolution of the resist pattern degrades. Therefore, a problem of the degradation of the resolution can be resolved with the extended exposure instead of normal exposure.

According to the present invention, a manufacturing method of a thin-film magnetic head forming a side shield with a resist pattern; the method comprising steps of: forming a resist film with a coating resist containing photo-acid-generator on a main magnetic pole layer formed on a substrate, where gradient angle of the main magnetic pole layer is equal to 90 degrees or more, exposing a portion where the main magnetic pole layer is formed along a height direction and generating acid from said photo-acid-generator, forming the resist pattern to reduce a resist residue on the main magnetic pole layer.

It is preferable that said side shield is formed by forming a convex portion of magnetic metal material covering said main magnetic pole layer, eliminating said resist pattern, and then polishing said convex portion.

It is preferable that a concentration of said photo-acid-generator is less than 1% by weight.

It is preferable that said photo-acid-generator is either Triphenylsulfoniumhexafluoroantimonate photo-acid-generator, Triphenylsulfonium type photo-acid-generator, or Bisiodonium type photo-acid-generator.

It is preferable that baking of said resist film is preformed from 60° C. to 70° C. after forming said resist film and before said exposure. Further, it is more preferable that baking of said resist film is preformed at 60° C. after forming said resist film and before said exposure. Further, it is preferable that said exposure of the resist film is an extended exposure.

The side shield formed by the forming process is formed only in front of a height direction of the main magnetic pole layer because a resist wall is positioned in the back to height direction of the main magnetic pole layer. Also, in the resist wall, the resist residue does not influence the forming of the side shield because the resist residue is reduced.

BRIEF DESCRIPTION OF THE SEVERAL VIEWS OF THE DRAWINGS

FIG. 6 is a graph showing an experimental result of Table 1;

FIG. 7 is a graph showing an experimental result of Table 3; and

FIGS. 8a1 to 8f2 are schematic diagrams explaining succession of flows of the side shield forming process.

DETAILED DESCRIPTION OF THE INVENTION

FIGS. 2a to 2f are perspective views explaining an embodiment of a forming method of a resist pattern according to the present invention. Also, FIG. 2g is a flowchart showing an embodiment of a forming method of a resist pattern according to the present invention.

Figure 2A:
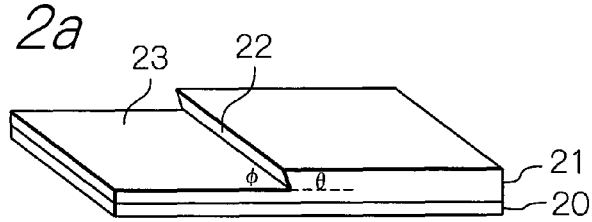
FIGS. 2a to 2f are perspective views explaining an embodiment of a forming method of a resist pattern according to the present invention.

FIG. 2a shows a layer 21, containing a step, formed on a substrate 20 according to the present embodiment. As the substrate 20, in the case of a thin film device such as a thin-film magnetic head, for example, AlTic substrate is used. The step has a gradient angle which is equal to 90 degrees or more. Here, the angle θ is a supplementary angle of an angle φ between a step wall surface 22 and a surface 23 of a layer containing the step.

Figure 2B:
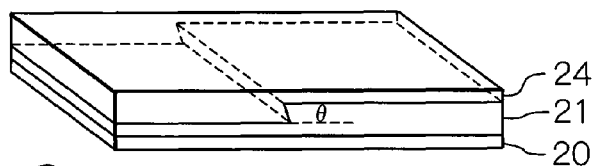

First, as shown in FIG. 2b, a resist film 24 whose thickness is approximately 1.0-2.0 μm (micro meter) is formed on the layer 21 containing the step with coating a chemically-amplified positive type resist containing photo-acid-generator whose concentration is less than 1% by weight (step S1 (FIG. 2g)).

As a high sensitive resist, a chemically-amplified resist is known, so the present invention uses the chemically-amplified resist. A conventional resist essentially utilizes photoreaction caused by exposure of light or electron beam, whereas the chemically-amplified resist contains the photo-acid-generator in the resist component and utilizes generated acid which serves as a catalyst. The chemically-amplified resist has a feature that significant sensitive increases are accomplished by utilizing catalytic reaction.

In this embodiment, the resist material whose major component is Propylene glycol methyl ether acetate (PGMEA) or poly hydroxy styrene (PHS) type plastic is used. Further, as photo acid generator, Triphenylsulfonium type photo acid generator is used.

Figure 3A:
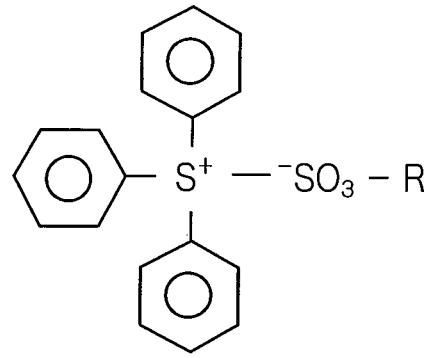
FIG. 3a is a structural formula showing Triphenylsulfonium type photo-acid-generator.
Figure 3B:
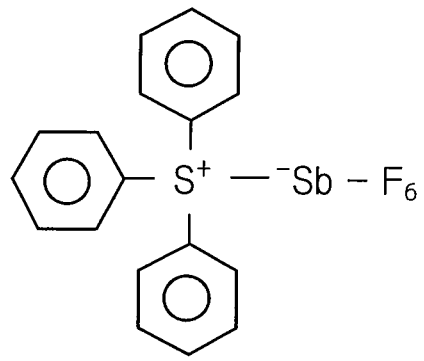
FIG. 3b is a structural formula showing Triphenylsulfoniumhexafluoroantimonate photo-acid-generator.
Figure 3C:
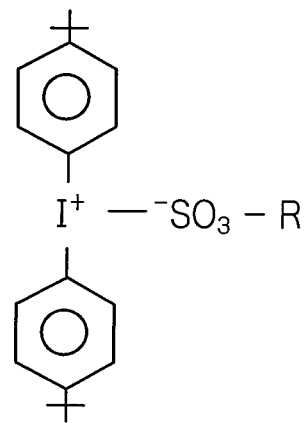
FIG. 3c is a structural formula showing Bisiodonium type photo-acid-generator.

FIG. 3a is a structural formula showing Triphenylsulfonium type photo-acid-generator. In this figure, R shows a carbon chain, for example, $CF_4$(Triphenylsulfoniumtriflate). Further, as photo-acid-generator, besides Triphenylsulfonium type photo-acid-generator, Triphenylsulfoniumhexafluoroantimonate photo-acid-generator and Bisiodonium type photo-acid-generator could be used. FIG. 3b is a structural formula showing Triphenylsulfoniumhexafluoroantimonate photo-acid-generator. Also, FIG. 3c is a structural formula showing Bisiodonium type photo-acid-generator. In FIG. 3c, R shows a carbon chain, for example, $C_4F_9$.

Figure 2C:
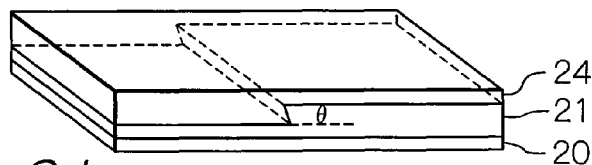

Next, as shown in FIG. 2c, a baking before an exposure (pre-baking) is performed at temperature of 60° C.-120° C. for 1.5-4 minutes (step S2 (FIG. 2g)). After forming the resist film 24, the pre-baking is preformed to evaporate solvent in the resist.

When temperature of the pre-bake is lower, the diffusion of the photo-acid-generator becomes large, and then resolution of the resist pattern degrades. For this reason, typically, temperature of the pre-bake is high temperature such as 80° C.-120° C., preferably 100° C. or more.

When residual solvent in the resist remains, it is found that diffusion distance of the photo-acid-generator becomes large. Since the pre-bake has the function eliminating this solvent, with the temperature of the pre-bake being lower than usual, residual solvent is large so that the diffusion distance of the photo-acid-generator becomes large. This makes the photo-acid-generator reach an unexposed portion or hardly exposed portion. As a result, the resist residue decrease.

Figure 2D:
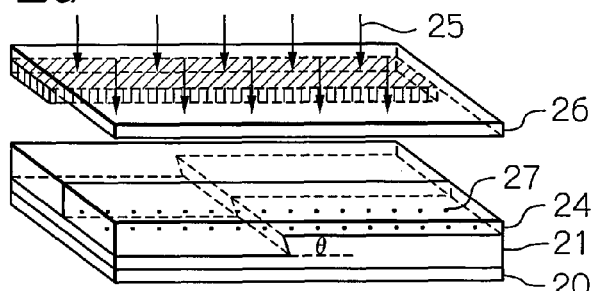
Figure 2E:
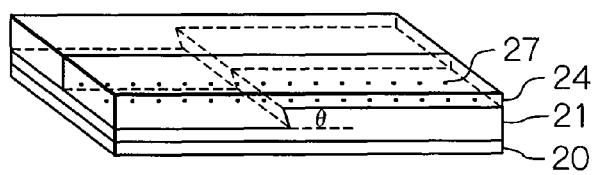

Next, as shown in FIG. 2d, an exposure is performed (step S3 (FIG. 2g)). The exposure irradiates the resist film 24 by Deep UV light 25 such as excimer laser whose wavelength is 248 nm with a predetermined pattern via a reticle 26. This exposure generates a few acid 27 at the exposed portion.

Thereafter, a baking after the exposure (post bake, PEB, Post Exposure Bake) is performed at temperature of approximately 60° C.-100° C. for 1.5-4 minutes (step S4 (FIG. 2g)). Since the post bake provides heat energy, the acid 27 generated by the exposure is diffused so that solubility toward alkaline developer becomes large at the exposed portion.

Figure 2F:
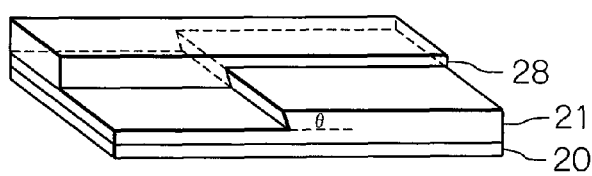
Figure 2G:
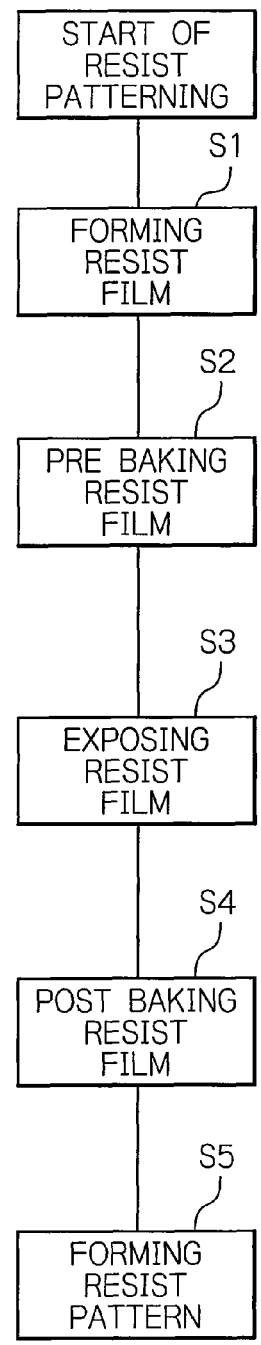
FIG. 2g is a flowchart showing an embodiment of a forming method of a resist pattern according to the present invention.

Finally, as shown in FIG. 2f, a development forms a resist pattern 28 by eliminating the portion where the acid is generate, with the alkaline developer of predetermined concentration.

As above explained, this method uses the chemically-amplified resist in order to reduce a resist residue in forming the resist pattern on a step whose gradient angle is equal to 90 degrees or more. In other words, by using a chemical method and not an optical method, this method make the acid reach an unexposed portion or hardly exposed portion so that the resist residue is reduced.

Further, this method uses an extended exposure instead of a usual exposure at the exposure in FIG. 2d to resolve the problem that resolution of the resist pattern degrades due to the lower pre-bake temperature than usual.

The extended exposure is the exposure method that wafer divides shots then an exposure amount is adjusted to each shot. First, the extended exposure measures resist width at each shot of some wafer and classifies the shot into a plurality of groups according to deviation from the mean value of the resist width. Since the resist width of each shot is the same in any wafer, it is sufficient to measure the resist width in one wafer. Next, the extended exposure defines the most suitable exposure amount at each classification according to the measured resist width. The extended exposure is the method that each shot is exposed by the exposure amount due to the classification.

Figure 4:
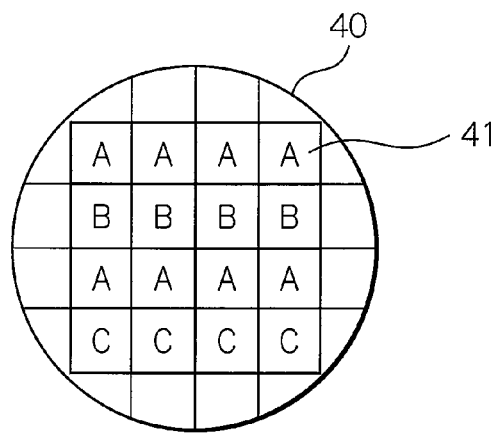
FIG. 4 is a schematic diagram of a wafer showing one embodiment of the extended exposure.

FIG. 4 is a schematic diagram of wafer showing one embodiment of the extended exposure. In this figure, there are sixteen shots 41 in the wafer 40. Measuring the resist width to each shot, the shots are classified into A, B, and C by the resist width. For example, the class A has the resist width more than the mean value+the standard deviation, the class B has the resist width less than or equal to the mean value+the standard deviation and more or equal to the mean value−the standard deviation, and the class C has the resist width less than the mean value–the standard deviation. The suitable exposure amounts EA, EB, EC are defined to each class A, B, C. When exposing the wafer of each shot, the shot of class A is exposed by the exposure amount EA, the shot of class B is exposed by the exposure amount EB, and the shot of class C is exposed by the exposure amount EC. In this figure, there are only sixteen shots, but there might be more shots for a real wafer. Further, in this example, the classifications of the shots are three, but there might be other than three.

As explained above, since the extended exposure gives the suitable exposure amount to each shot, the extended exposure resolves the problem that resolution of the resist pattern degrades.

Further, as above mentioned, the baking after the exposure (PEB) is performed in the chemically-amplified resist. The PEB is performed to diffuse evenly the acid generated by the exposure. For this reason, adjustment of the PEB temperature as well as the pre-bake temperature can make the acid reach an unexposed portion or hardly exposed portion. However, the adjustment of the PEB temperature doesn't change the width of the resist residue.

Further, although the present embodiment is the method to form the resist pattern on the layer including the steps formed on the substrate, the present invention is applicable to form the resist pattern on the substrate including the steps.

Below, using practical examples and a comparative example, the effect of the forming method of resist pattern according to the present invention is explained.

COMPARATIVE EXAMPLE

Figure 5:
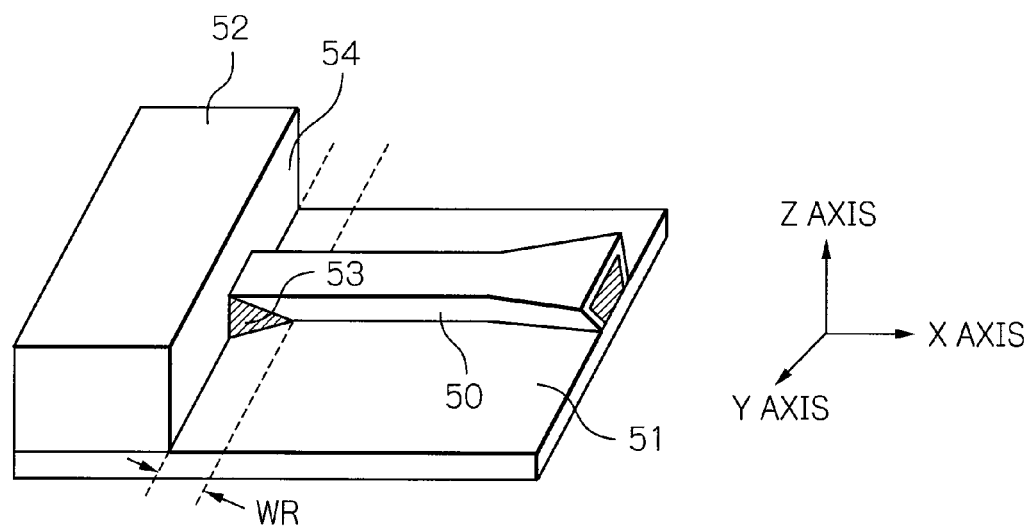
FIG. 5 is a schematic diagram of a resist pattern formed on a step on a substrate, where the gradient angle of the step is equal to 90 degrees or more, with pre-baked at 120° C. which is an ordinary range with a chemically-amplified resist.

FIG. 5 is a schematic diagram of a resist pattern 52 formed on a step on a substrate, where gradient angle of the step is equal to 90 degrees or more, with pre-baked at 120° C. which is an ordinary range with a chemically-amplified resist. As a result, a resist residue 53 is generated at the portion among a wall surface 50, a surface 51 of the layer containing the step, and a resist pattern 52. In FIG. 5, a dark portion enclosed in the dotted line is the resist residue 53. A resist residue width WR is defined as the width from an edge face 54 of the resist pattern to a portion where the resist residue 53 vanishes. In FIG. 5, the width between the dotted lines along an x-axis corresponds the resist residue width WR. Moreover, as shown in latter experimental result, this measured value was 203 nm (nanometer).

As above explained, using the chemically-amplified resist instead of the photo resist with the pre-bake at 120° C. which is an ordinary range, the resist residue could not be sufficiently reduced, which is generated when the resist pattern was formed on the step on the substrate, where gradient angle of the step is equal to 90 degrees or more.

PRACTICAL EXAMPLE 1

Table 1 shows an experimental result about a relationship between the pre-bake temperature and the resist residue width WR when the resist pattern is formed on the step formed on the substrate, where the gradient angle of the step is 90 degree or more, using chemically-amplified resist and lowering the temperature of the pre-bake. Also, FIG. 6 is a graph showing an experimental result of Table 1.

TABLE 1

| Pre bake Temperature (° C.) | Resist Residue width (nm) |
| --- | --- |
| 120 | 203 |
| 100 | 188 |
| 80 | 143 |
| 60 | 49 |

According to the Table 1, it is found that the resist residue width WR reduces with lower and lower the pre-bake temperature. For example, when the pre-bake temperature is 60° C., the resist residue width WR is 49 nm. In this way, the low pre-bake temperature makes the resist residue width WR reduce sufficiently.

Further, when a plating applies to the resist pattern, the resist residue width WR should be equal to or lower than 100 nm to form a desired plating. Therefore, the pre-bake temperature should be equal to or lower than 70° C. according to FIG. 6.

In this way, the pre-bake temperature 70° C. makes the resist residue width WR reduce less than half that of the pre-bake temperature 120° C. Further, the pre-bake temperature 60° C. makes the resist residue width WR reduce less than quarter that of the pre-bake temperature 120° C.

As above mentioned, the low pre-bake temperature makes the resist residue width reduce. When temperature of the pre-bake is lower, as above explained, residual solvent in the resist remains. Since diffusion of the photo-acid-generator becomes large, this makes photo-acid-generator reach an unexposed portion or hardly exposed portion.

However, the diffusion of the photo-acid-generator has a side-effect that resolution of the resist pattern degrades. Therefore, in order to confirm the degradation of the resolution of the resist pattern due to the low pre-bake temperature, the degradation of the resolution is measured by the experiment to form the resist pattern with the chemically-amplified resist, the pre-bake at 120° C., 80° C., and 60° C., and the exposure. The result of the degradation of the resolution of the resist pattern due to the low pre-bake temperature is shown below.

Table 2 shows an experimental result about a relationship between the pre-bake temperature and three times a standard deviation $3\sigma$ of the resist residue width WR when the resist pattern is formed with chemically-amplified resist and the low temperature of the pre-bake. The experiment obtained the standard deviation $\sigma$ of the measured values with forming a plurality of the resist patterns whose width is 3.0 μm in the wafer, selecting 40 formed resist patterns, and measuring the resist width of the selected resist patterns.

TABLE 2

| Pre bake Temperature (° C.) | $3\sigma$ (40 points in wafer) μm |
| --- | --- |
| 120 | 0.048 |
| 80 | 0.062 |
| 60 | 0.075 |

According to this experimental result, it is found that the $3\sigma$ of the resist width increases with lower and lower the pre-bake temperature. For example, when the pre-bake temperature is 60° C., the $3\sigma$ of the resist width degenerates more than one and half times that of the pre-bake temperature 120° C. Also, when the pre-bake temperature is 80° C., the $3\sigma$ of the resist width degenerates more than 1.3 times that of the pre-bake temperature 120° C. The increase of the $3\sigma$ of the resist width can occur the case that the resist pattern does not maintain a good shape and size.

PRACTICAL EXAMPLE 2

Table 3 shows an experimental result about the 3σ of the resist width when the resist pattern is formed with chemically-amplified resist, pre-bake at 60° C., and the extended exposure, for comparison, and shows an experimental result about a relationship between the pre-bake temperature and the 3σ of the resist width when the resist pattern is formed with chemically-amplified resist and no extended exposure. FIG. 7 is a graph showing an experimental result of Table 3. Here, the result not to perform the extended exposure is the same as the Table 2. As well as not performing the extended exposure, the experiment obtained the standard deviation σ of the measured values with forming a plurality of the resist patterns whose width is 3.0 μm in the wafer, selecting 40 formed resist patterns, and measuring the resist width of the selected resist patterns.

TABLE 3

| Pre bake Temperature (° C.) | 3σ (40 points in wafer) μm | Extend Exposure |
|---|---|---|
| 120 | 0.048 | No |
| 80 | 0.062 | No |
| 60 | 0.075 | No |
| 60 | 0.041 | Yes |

According to the Table 3, when the extend exposure is performed, the 3σ of the resist width becomes 0.041 μm at the pre-bake temperature 60° C. This substantially reduces from the 3σ of the resist width 0.075 μm at the pre-bake temperature 60° C. when the normal exposure is performed. Further, this value of the extended exposure is lower than the 3σ of the resist width 0.048 μm at the pre-bake temperature 120° C. when the normal exposure is performed. This shows that the sufficient resolution of the resist pattern can be obtained by using the extended exposure even if the pre-bake temperature is 60° C.

As mentioned above, the problem that the degradation of the resolution occurs at the low pre-bake temperature is resolved by using the extended exposure instead of the normal exposure. (Side shield forming process)

Next, the side shield forming process of a write head element, which uses the resist pattern formed by the present embodiment, in a thin-film magnetic head is explained.

The side shield is set in a neighborhood of side portion at a tip of main magnetic pole layer along a track width direction. The side shield absorbs noise magnetic field generated from a side track. For this reason, the side shield prevents already recorded information on same track from reversing.

FIGS. 8a1 to 8/2 are schematic diagrams explaining succession of flows of the side shield forming process. In these figures, FIGS. 8a1, 8b1, 8c1, 8d, 8e, and 8/1 show cross-section drawings viewed from an ABS (air bearing surface) and FIGS. 8a2, 8b2, 8c2, and 8/2 show plane drawings viewed from a positive z-axis.

Figure 1A:
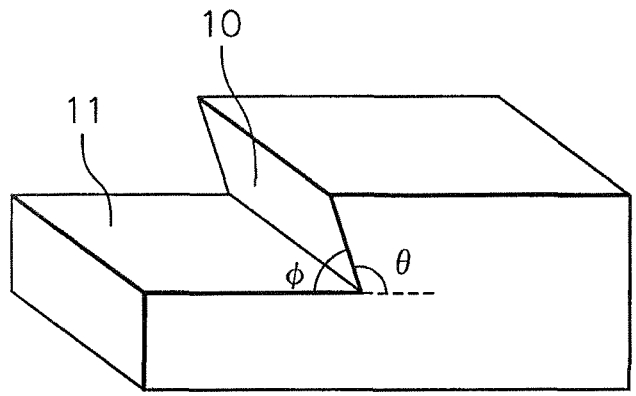
FIGS. 1a and 1b are schematic diagrams showing occurrence of a resist residue when a resist pattern is formed on a step, whose gradient angle is 90 degrees or more, formed on substrate, by a conventional forming method of the resist pattern.
Figure 1B:
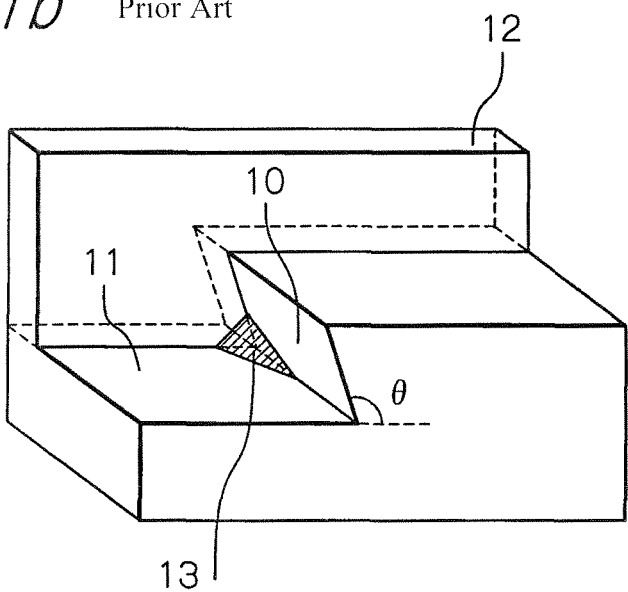

As shown in FIG. 8a1, a main magnetic pole layer 81 is formed on a substrate made of conductive material such as AlTiC ($Al_2O_3$—TiC). The main magnetic pole layer 81 is a magnetic path to guide and converge magnetic flux, which is generated with write current applied to a write coil layer (not shown), to a perpendicular magnetic recording layer of the magnetic disk to be written thereon. The main magnetic pole layer 81 can be formed of metal magnetic material or a multilayer of the metal magnetic material such as, for example, NiFe, CoFe, NiFeCo, FeAlSi, FeN, FeZrN, FeTaN, CoZrNb, and CoZrTa with a thickness of approximately 0.5-3 μm by using a frame plating. As shown in FIG. 8a1, the main magnetic pole layer 81 is formed as shape having the step whose gradient angle is equal to 90 degrees or more.

The main magnetic pole layer 81 is covered with a insulation layer 82. The insulation layer 82 is formed of, for example, insulation material such as $Al_2O_3$ or $SiO_2$ with filmed by using such as sputtering. If need, an upper surface is planarized by using such as a chemical mechanical polishing (CMP).

After forming the main magnetic pole layer 81, as shown in FIGS. 8b1 and 8b2, a positive type photo resist containing the photo-acid-generator is coated on the main magnetic pole layer 81. As the resist material, the resist material whose major component is PGMEA resist material is used. As the photo-acid-generator, Triphenylsulfonium type photo-acid-generator, Triphenylsulfoniumhexafluoroantimonate photo-acid-generator, or Bisiodonium type photo-acid-generator is used. As shown in FIGS. 8c1 and 8c2, using the forming method of the resist pattern according to the practical example 1 or the practical example 2 of the present embodiment, a resist pattern 83 is formed, which has a resist wall positioned in the back to height direction.

Next, as shown in FIG. 8d, as covering the main magnetic pole layer 81, a convex portion 84 is formed of metal magnetic material or a multilayer of the metal magnetic material such as, for example, NiFe, CoFe, NiFeCo, FeAlSi, FeN, FeZrN, FeTaN, CoZrNb, and CoZrTa with a thickness of approximately 0.5-3 μm by using such as the sputtering or the frame plating.

Next, as shown in FIG. 8e, with exfoliating the resist pattern 83, an $Al_2O_3$ layer 85 is formed, for example, by using the sputtering.

Finally, as shown in FIG. 8/1 and 8/2, by polishing the convex portion 84 and the $Al_2O_3$ layer 85 with such as the CMP parallel to the height direction and the track width direction until the main magnetic pole layer 81 exposes, their surfaces are planarized. This forms the side shields 86 at right and left of the main magnetic pole layer 81 to track width direction.

As explained above, the side shield 86 formed by the forming process is formed at only in front of the height direction of the main magnetic pole layer 81 because a resist wall is positioned in the back to the height direction of the main magnetic pole layer 81. Also, in the resist wall, the resist residue does not influence the forming of the side shield 86 because the resist residue width reduces.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:

1. A manufacturing method of a thin-film magnetic head forming a side shield with a resist pattern, the method comprising steps of:

forming a resist film with coating resist containing photo-acid-generator on a main magnetic pole layer formed on a substrate, where gradient angle of the main magnetic pole layer is equal to 90 degrees or more;

exposing a portion where the main magnetic pole layer is formed along height direction and generating acid from said photo-acid-generator; and forming the resist pattern to reduce a resist residue on the main magnetic pole layer, wherein said exposure of the resist film is an extended exposure.

2. The manufacturing method as claimed in claim 1, wherein said side shield is formed by forming a convex portion of magnetic metal material covering said main magnetic pole layer, eliminating said resist pattern, and then polishing said convex portion.

3. The manufacturing method as claimed in claim 1, wherein a concentration of said photo-acid-generator is less than 1% by weight.

4. The manufacturing method as claimed in claim 1, wherein said photo-acid-generator is either Triphenylsulfoniumhexafluoroantimonate photo-acid-generator, Triphenylsulfonium type photo-acid-generator, or Bisiodonium type photo-acid-generator.

5. The manufacturing method as claimed in claim 1, wherein baking of said resist film is preformed from 60° C. to 70° C. after forming said resist film and before said exposure.

6. The manufacturing method as claimed in claim 1, wherein baking of said resist film is preformed at 60° C. after forming said resist film and before said exposure.

7. A manufacturing method of a thin-film magnetic head forming a side shield with a resist pattern, the method comprising steps of:

forming a resist film with coating resist containing photo-acid-generator on a main magnetic pole layer formed on a substrate, where gradient angle of the main magnetic pole layer is equal to 90 degrees or more;

baking the resist film at temperature of loner than 80° C.;

exposing a portion where the main magnetic pole layer is formed along height direction and generating acid from said photo-acid-generator; and forming the resist pattern to reduce a resist residue on the main magnetic pole layer, wherein said exposure of the resist film is an extended exposure.

8. The manufacturing method as claimed in claim 7, wherein said side shield is formed by forming a convex portion of magnetic metal material covering said main magnetic pole layer, eliminating said resist, pattern, and then polishing said convex portion.

9. The manufacturing method as claimed in claim 7 wherein a concentration of said photo-acid-generator is less than 1% by weight.

10. The manufacturing method as claimed in claim 7, wherein said photo-acid-generator is either Triphenylsulfoniumhexafluoroantimonate photo-acid-generator, Triphenylsulfonium type photo-acid-generator, or Bisiodonium type photo-acid-generator.

11. The manufacturing method as claimed in claim 7, wherein said temperature of lower than 80° C. is 60° C. to 70° C.

12. The manufacturing method as claimed in claim 7, wherein said temperatures of lower an 80° C. is 60° C.

* * * * *